United States Patent [19]
Druschke et al.

[11] Patent Number: 5,863,636
[45] Date of Patent: Jan. 26, 1999

[54] ADHESIVE BOND FOR DENSELY ORDERED ELEMENTS

[75] Inventors: Frank Druschke, Stuttgart; Gerhard Elsner, Kaarst; Johann Greschner, Pliezhausen; Roland Stoehr, Nufringen, all of Germany

[73] Assignee: International Business Machines Corporation, Armonk, N.Y.

[21] Appl. No.: 887,377

[22] Filed: Jul. 2, 1997

[30] Foreign Application Priority Data

Jul. 8, 1996 [DE] Germany .................. 196 27 442.7

[51] Int. Cl.⁶ .................................................. B32B 3/10
[52] U.S. Cl. ..................... 428/136; 428/137; 324/756; 324/72.5
[58] Field of Search .................... 324/756, 72.5; 428/136, 137, 446

[56] References Cited

FOREIGN PATENT DOCUMENTS 0 165 331 B1  6/1984  Germany .................. G01R 1/073
0 283 545 B1  3/1987  Germany .................. G01R 1/073

*Primary Examiner*—Christopher Raimund
*Attorney, Agent, or Firm*—Ira D. Blecker

[57] ABSTRACT

The invention relates to an adhesive bond 1 for a plurality of densely packed elements 4a, 4b, 4c guided into a plate pack 3. At the plate surface 2 with the adhesive bond 1 the guidance holes 5a are made larger than the guidance holes 5b in the remainder of the plate pack (3) and the adhesive bond is effected by means of a highly viscous adhesive. Because of the larger opening 5a, an adhesive reservoir 10 is formed at the plate surface 2. This makes it possible to use high viscosity adhesives. The geometric features and the use of a highly viscous adhesive make it possible to manufacture durable and heat-resistant adhesive bonds for elements such as wires, glass fibers or micromechanical components.

8 Claims, 2 Drawing Sheets

ADHESIVE BOND FOR DENSELY ORDERED ELEMENTS

FIELD OF THE INVENTION

The invention relates to an adhesive bond for a plurality of densely packed elements guided in a plate perpendicularly to the plate surface. The adhesive bond is on the surface of the plate.

BACKGROUND OF THE INVENTION

For the electric testing of microelectronic components, test heads based on the buckling beam concept, as described in European patents 0 165 331 and 0 283 545 are increasingly employed. Such contact probe arrangements comprise, inter alia, a first perforated plate pack, in which the contact probes are guided so as to be laterally deformable, and a second perforated plate pack, on or in which the contact probes are attached.

The fastening of the contact probes through embedding or adhesive bonding is no longer possible with very densely arranged contact probes. FIG. 1a shows the problems which arise in embedding or bonding, particularly with those contact probes which are covered with an insulating layer 6. Layer 8 is, for example, a copper layer. This insulating layer surrounding the contact probes outside the second perforated plate pack mostly ends directly at the guide holes intended for the contact probes in the second perforated plate pack and there forms a blockage. No adhesive or embedding material can flow into the guidance hole when it is blocked in this way.

A suitable low viscosity adhesive for a lasting and heat-resistant adhesive bond between the partly insulated contact probes and the second perforated plate pack is e.g. EPOTEK 353-ND. As shown in FIG. 1b, such adhesives rise to a height of 15 mm on the contact probes, which is unacceptable.

Highly viscous adhesives or thixotropic adhesives such as EPOTEK 353-ND/T, of course, climb up the contact probes only negligibly, to a height of approximately 2 mm but, on the other hand, do not penetrate sufficiently deeply into the guidance holes of the perforated plate pack, so that the contact probes have an inadequate fastening action. This problem is shown in FIG. 1c.

Both EPOTEK 353ND and EPOTEK 353ND-T are two component epoxy adhesives available from Epoxy Technology Inc., 14 Fortune Drive, Billerica, Mass. 01821. Epoxy 353ND has a viscosity of 2000 CPS, a TCE (thermal coefficient of expansion) of $54 \times 10^{-6}$/K and a lap shear strength of 1500 PSI while EPOTEK 353ND-T has a viscosity of 43000 CPS, a TCE of $43 \times 10^{-6}$/K and a lap shear strength of 1500 PSI.

It is the object of the present invention to provide a durable and heat-resistant adhesive bond at the surface or in depth of a plate for densely ordered elements at any angle to the surface of the plate of the guided element.

BRIEF SUMMARY OF THE INVENTION

The object of the present invention has been achieved by the provision of at the plate surface or within the plate pack with the adhesive bond the openings or guidance openings are larger than the guidance holes in the remaining plate and the adhesive bond is made with a highly viscous adhesive. The guidance holes with the enlarged opening need not be limited only to the surface of the plate, but can also continue, if required, to greater depths within the plate.

The larger guidance openings at the surface of the plate with the adhesive bond prevent the blockage of the guidance holes by the insulating layer surrounding the densely packed elements. In addition, an adhesive reservoir is formed by the larger guidance openings at the surface of the plate with the adhesive bond. This makes it possible to use high-viscosity adhesives.

The geometric features and the application of a highly viscous adhesive make it possible to manufacture a durable and heatresistant adhesive bond.

BRIEF DESCRIPTION OF THE DRAWINGS

The invention is explained in more detail in the following with the aid of the drawings, which show:

FIG. 2 shows that adhesive bond 1 at surface 2 of plate pack 3. Instead of a plurality of densely arranged elements perpendicular to the plate surface leading into plate pack 3, here, by way of example, only 3 contact probes 4a,4b and 4c are shown.

Figure 1A:
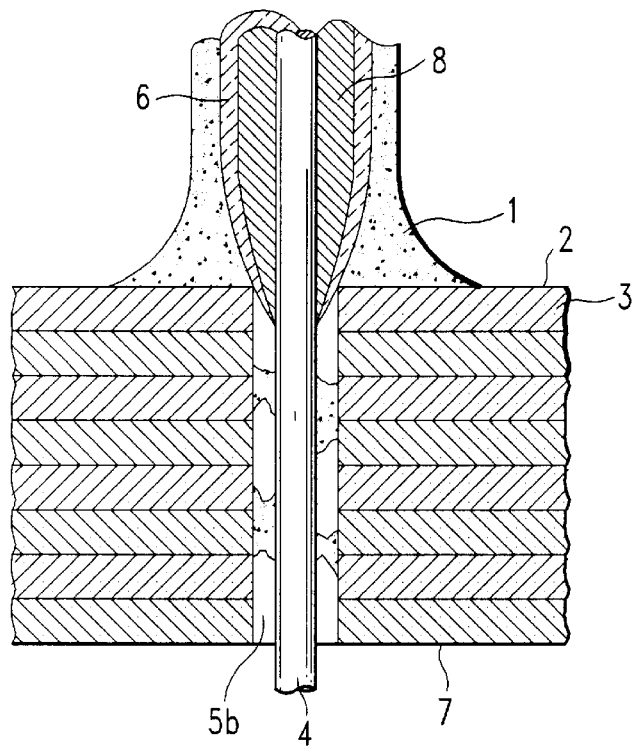
FIG. 1 a–c standardized cross-sections through different adhesive bonds from the state of the art.
Figure 2:
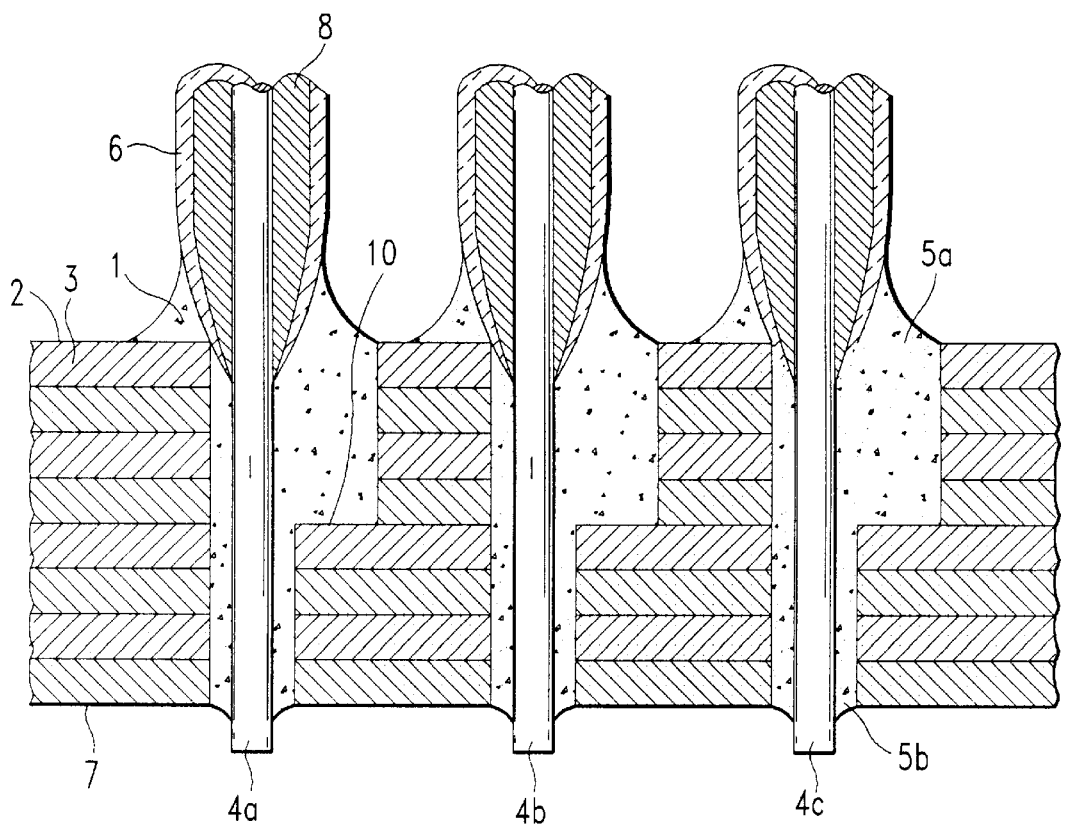
FIG. 2 a standardized cross-section through the adhesive bond in accordance with the present invention and several contact probes at the surface of a plate.
Figure 1B:
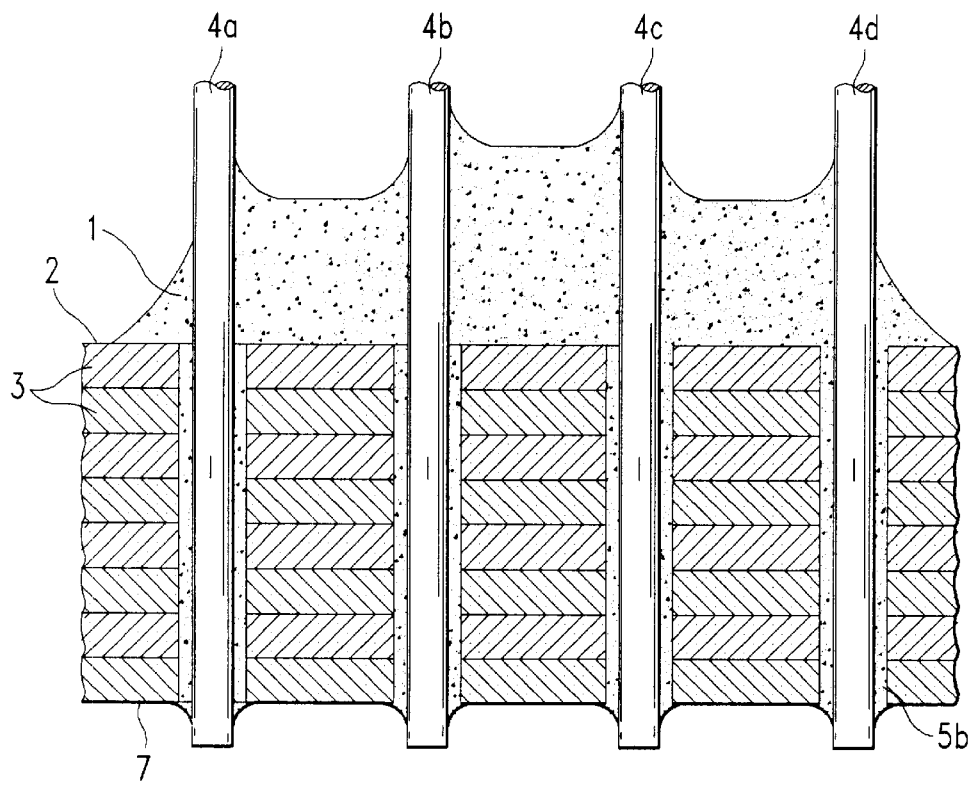
Figure 1C:
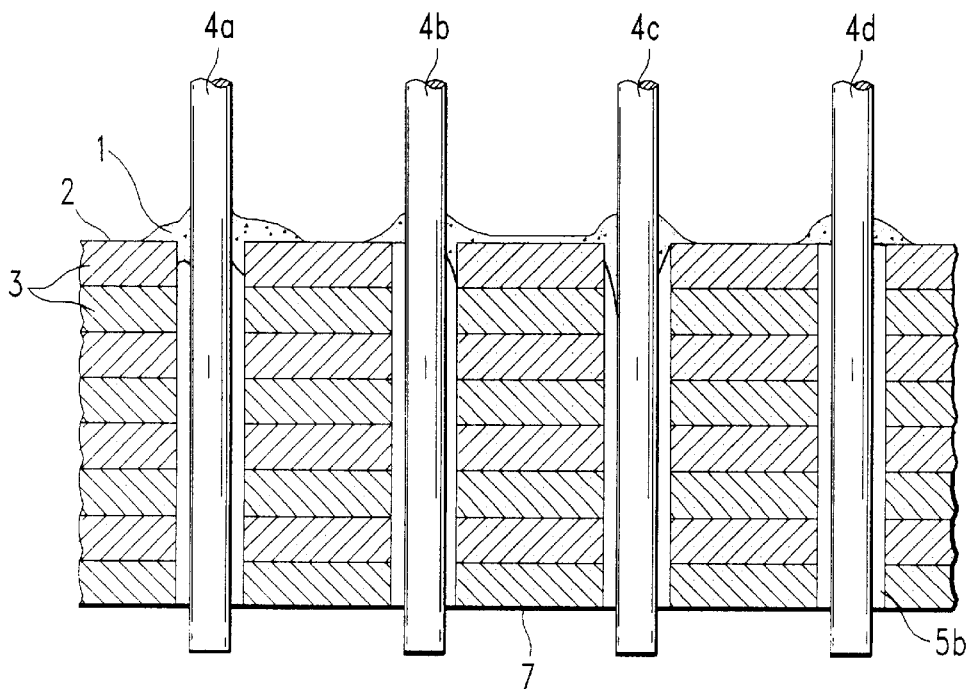

In the preferred embodiment shown in FIG. 2, plate pack 3 is designed as a stack of plates. At stack surface 2 with adhesive bond 1, the guidance holes 5a in one or more plates are larger than the guidance holes 5b in the remaining plates. Where only one plate having an enlarged opening is used, the corresponding guidance openings 5a adjacent to the surface 2 with the adhesive bond are larger than the guidance holes 5b in the remaining plates.

A highly viscous adhesive is employed as the adhesive. The larger guidance openings 5a take the rheology of such adhesives into account, in that an adhesive reservoir 10 is formed at the place where the adhesive bond should be effected. As a consequence, the highly viscous adhesives can penetrate more deeply and more completely into the capillary opening between the contact probes 4a, 4b, 4c and the corresponding guidance hole, 5a or 5b. In addition, this special geometry prevents insulating layer 6 surrounding the contact probes from blocking the respective guidance hole.

Instead of contact probes, the elements 4a, 4b and 4c can be a wide variety of wires, glass fibers or micromechanical components. Elements 4a, 4b, 4c typically have a diameter of 25 $\mu$m to 100 $\mu$m.

As adhesives, a thixotropic adhesive or a thixotropic or high viscosity adhesive mixture can also be used. Preferred adhesives are EPOTEK 353ND-T or mixtures of EPOTEK 353ND and EPOTEK 353ND-T in the ratios of 73:27 to 10:90 (ratio EPOTEK 353ND to EPOTEK 353ND-T).

For example, with test heads based on the buckling beam concept, several hundred contact probes have to be fixed. Such contact probes are mostly CuBe wires with diameters of typically 25–50 mm, covered with an insulating sleeve. The fixing by means of the adhesive bond in accordance with the present invention ensures that each individual wire is secured in its guidance hole in the plate pack.

The adhesive bond in this example must withstand a force of approximately 0.15 newtons per wire. The complication arises, moreover, that the parts to be joined often consist of different materials. In the example of the buckling beam test heads, the plate pack is constructed of Si plates. Thus materials with very different thermal expansion coefficients are to be joined. This further condition of joining different materials is met by the adhesive bond toughness and heat resistance in accordance with the present invention through the use of a highly viscous or thixotropic adhesive.

In this example it is often advantageous to form the guidance holes 5a at the plate surface 2 with the adhesive bond 1 as slots and to provide round guidance holes 5b in the remaining plates. However, all other hole shapes are possible for the guidance holes. Likewise the guidance holes 5a in the area of the adhesive bond can have a different shape from the guidance holes in the remaining plates of the plate pack 3.

Up to what depth in the plate the guidance openings should be made larger in order to guarantee an acceptable and heat-resistant combination, is highly dependent upon the choice of the adhesive and its characteristics. The higher the viscosity or the more thixotropic the adhesive is, the further into the plate the larger guidance openings must be extended. In a plate pack, the number of plates with larger guidance openings must be increased accordingly. The contrary applies if a less viscous or less thixotropic adhesive is used.

It will be apparent to those skilled in the art having regard to this disclosure that other modifications of this invention beyond those embodiments specifically described here may be made without departing from the spirit of the invention. Accordingly, such modifications are considered within the scope of the invention as limited solely by the appended claims.

We claim:

1. An article comprising:

a plate pack (3) having a plurality of plates;

a plurality of guidance openings penetrating the plate pack (3), each of the guidance openings comprising an enlarged portion (5a) at a surface (2) of the plate pack (3) and a smaller portion (5b) in the remainder of the plate pack(3);

a plurality of elements (4a, 4b, 4c) guided within the guidance openings at any angle to the surface (2) of the plate pack(3); and an adhesive (1) bonding the densely packed elements (4a, 4b, 4c) to the plate pack (3), the adhesive (1) at least partially filling the enlarged portions (5a) of the guidance openings, wherein the adhesive is a highly viscous orthixotropic adhesive.

2. The article in accordance with claim 1 wherein the elements (4a, 4b, 4c) are selected from the group consisting of wires, glass fibers and micromechanical components.

3. The article in accordance with claim 1 wherein the enlarged portions of the guidance openings are formed as slots and the smaller portions of the guidance openings are formed as round holes.

4. The article in accordance with claim 1 wherein material for the plate pack (3) includes Si and the material for elements (4a, 4b, 4c) includes CuBe.

5. The article in accordance with claim 1 wherein the elements (4a, 4b, 4c) have a diameter of 25 $\mu$m to 100 $\mu$m.

6. The article in accordance with claim 1 wherein the adhesive completely fills the guidance openings.

7. The article in accordance with claim 1 wherein the adhesive (1) is a highly viscous adhesive.

8. The article in accordance with claim 1 wherein the adhesive (1) is a thixotropic adhesive.

* * * * *